US009183918B2

(12) United States Patent
Ko et al.

(10) Patent No.: US 9,183,918 B2
(45) Date of Patent: Nov. 10, 2015

(54) STACKED SEMICONDUCTOR APPARATUS FOR GENERATING REFRESH SIGNAL

(71) Applicant: SK hynix Inc., Icheon-si Gyeonggi-do (KR)

(72) Inventors: Jae Bum Ko, Icheon-si (KR); Sang Jin Byeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/258,190

(22) Filed: Apr. 22, 2014

(65) Prior Publication Data

US 2015/0187405 A1    Jul. 2, 2015

(30) Foreign Application Priority Data

Dec. 30, 2013    (KR) .................. 10-2013-0166558

(51) Int. Cl.
*G11C 7/00*        (2006.01)
*G11C 11/406*    (2006.01)

(52) U.S. Cl.
CPC ........ *G11C 11/406* (2013.01); *G11C 11/40618* (2013.01); *G11C 2211/406* (2013.01)

(58) Field of Classification Search
CPC .................. G11C 11/40618; G11C 11/406

USPC ............................................. 36/222
See application file for complete search history.

(56) References Cited

U.S. PATENT DOCUMENTS

| 8,199,599 B2 | 6/2012 | Jeddeloh | |
| 8,547,767 B2* | 10/2013 | Ruckerbauer et al. | 365/222 |
| 2008/0109597 A1 | 5/2008 | Schakel et al. | |
| 2010/0271888 A1* | 10/2010 | Rajan et al. | 365/194 |
| 2011/0194326 A1* | 8/2011 | Nakanishi et al. | 365/51 |
| 2012/0059984 A1* | 3/2012 | Kang et al. | 711/106 |
| 2014/0003171 A1* | 1/2014 | Ko | 365/194 |
| 2014/0192606 A1* | 7/2014 | Kang et al. | 365/222 |
| 2014/0355370 A1* | 12/2014 | Kim | 365/222 |

* cited by examiner

*Primary Examiner* — Son Mai
(74) *Attorney, Agent, or Firm* — William Park & Associates Ltd.

(57) ABSTRACT

A stacked semiconductor apparatus includes a plurality of chips which are stacked one upon the other. One chip of the plurality of chips may be configured to generate a plurality of refresh period signals for performing refresh operations within the plurality of chips, and may be configured to transmit the plurality of refresh period signals to the plurality of chips excluding the one chip. The plurality of chips may respectively receive refresh period signals allocated to them according to chip ID signals, and may perform the refresh operations.

20 Claims, 7 Drawing Sheets

STACKED SEMICONDUCTOR APPARATUS FOR GENERATING REFRESH SIGNAL

CROSS-REFERENCES TO RELATED APPLICATION

The present application claims priority under 35 U.S.C. §119(a) to Korean application number 10-2013-0166558, filed on Dec. 30, 2013, in the Korean Intellectual Property Office, which is incorporated herein by reference in its entirety.

BACKGROUND

1. Technical Field

Various embodiments generally relate to a semiconductor apparatus, and more particularly, to a stacked semiconductor memory apparatus in which a plurality of chips are stacked.

2. Related Art

To improve the integration density of a semiconductor apparatus chips may be stacked and packaged making a 3D (three-dimensional) semiconductor apparatus. However, 3D semiconductor apparatuses have a maximum integration density limit.

One method of creating a 3D semiconductor apparatus is to implement a plurality of chips having the same structure by stacking them and connecting them all together with metal wires that are peripheral to the chips. With this configuration the plurality of chips may operate as a single semiconductor apparatus.

Another method of creating a 3D semiconductor apparatus is to implement TSV (through-silicon via) which pass through the plurality of stacked chips to electrically connect the chips. However, manufacturing 3D semiconductor apparatus that implement TSVs are subject to processing skews which may prevent the stacked chips from sequentially operating.

SUMMARY

In an embodiment, a stacked semiconductor apparatus includes a plurality of chips which are stacked one upon the other. One chip of the plurality of chips may be configured to generate a plurality of refresh period signals for performing refresh operations within the plurality of chips, and may be configured to transmit the plurality of refresh period signals to the plurality of chips excluding the one chip. The plurality of chips may respectively receive refresh period signals allocated to them according to chip ID signals, and may perform the refresh operations.

In an embodiment, a stacked semiconductor apparatus may include first and second chips stacked one upon the other. The first chip may include a first chip refresh command generation block configured to generate first and second internal refresh signals in response to a command signal, a chip select signal and a first chip ID signal. The stacked semiconductor apparatus may also include a first chip refresh period generation block configured to generate first and second refresh period signals in response to the first internal refresh signal and the second internal refresh signal, and a first chip refresh period selection block configured to select and output the first refresh period signal after the first refresh period signal and before the second refresh period signal, in response to a first chip ID signal. The second chip may include a second chip refresh period selection block configured to select and output the second refresh period signal after the first refresh period signal and before the second refresh period signal, in response to a second chip ID signal.

DETAILED DESCRIPTION

Hereinafter, examples of stacked semiconductor apparatuses for generating, for example, a refresh signal will be described below with reference to the accompanying drawings through various examples of embodiments.

Figure 1:
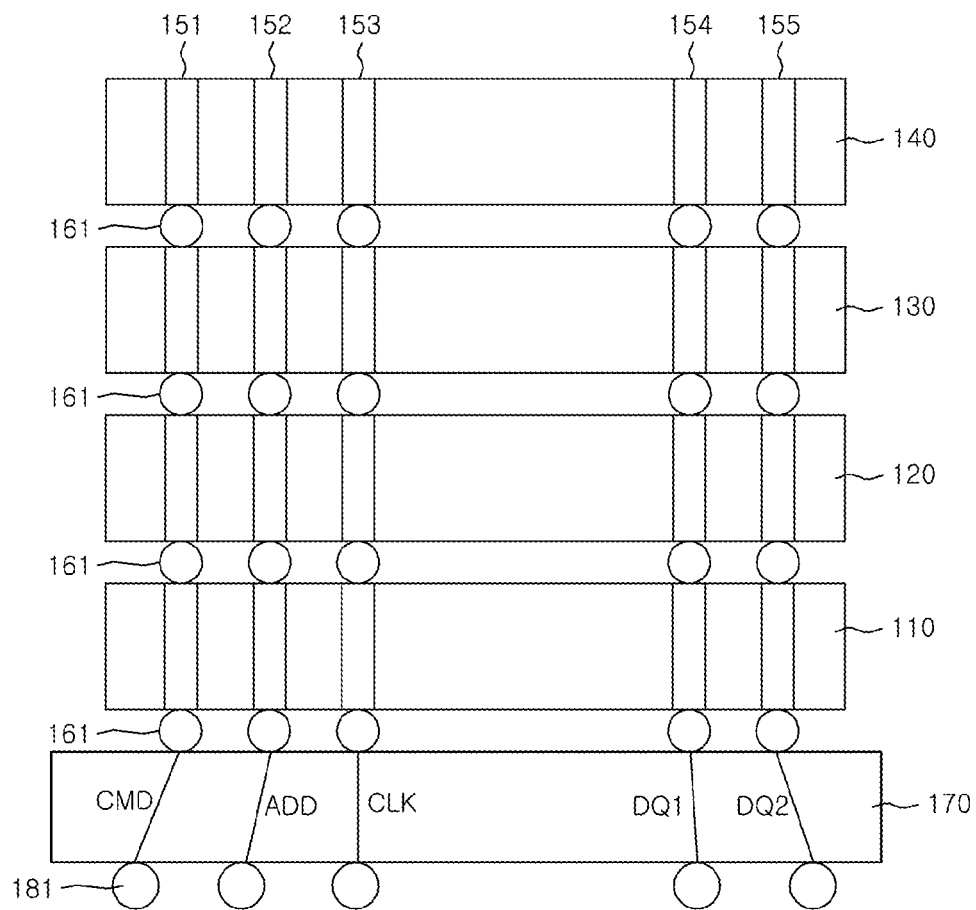
FIG. 1 is a view illustrating a representation of the configuration of a stacked semiconductor apparatus in accordance with an embodiment.

Referring to FIG. 1, a stacked semiconductor apparatus 1 may include first to fourth chips 110 to 140. The first to fourth chips 110 to 140 may be sequentially stacked, and may be packaged into a single package to constitute a single semiconductor apparatus. The first chip 110 may operate as a logic chip. The first chip 110 may operate as a memory controller or a processor. The second to fourth chips 120 to 140 may operate as core chips or memory chips. In an embodiment, the first chip 110 may operate as the same core chip or memory chip as the second to fourth chips 120 to 140. The first to fourth chips 110 to 140 may perform operations of receiving control signals and data from an external host device (not shown). The first to fourth chips 110 to 140 may also perform operations to store the data the data as well. The first to fourth chips 110 to 140 may also receive control signals from the external host device and output stored data. The first to fourth chips 110 to 140 may include memory cores for storing data.

The first to fourth chips 110 to 140 may be electrically connected with one another through, for example but not limited to, a plurality of through vias 151 to 155. The through vias 151 to 155 may be electrodes which are formed through the first to fourth chips 110 to 140. The through vias 151 to 155 may form signal paths which transmit signals among the first to fourth chips 110 to 140. The through vias 151 to 155 which are formed in the respective chips 110 to 140 may be connected with one another through bumps 161. The bumps may be disposed between the respective chips 110 to 140. The through vias 151 to 155 may be commonly connected with the first to fourth chips 110 to 140. The first to fourth chips 110 to 140 may transmit a command signal CMD, an address signal ADD, a clock signal CLK and data DQ1 and DQ2 to the first to fourth chips 110 to 140 by way of the through vias 151-155. While not shown, the semiconductor apparatus 1 may include an increased number of through vias to transmit additional control signals or additional data.

The stacked semiconductor apparatus 1 may further include an interface chip 170. The interface chip 170 may receive signals from the external host device or may output signals to the external host device. The interface chip 170 may receive signals such as but not limited to the command signals CMD, the address signals ADD, the clock signals CLK, data DQ1, and data DQ2. The interface chip 170 may also output signals such as but not limited to the command signals CMD, the address signals ADD, the clock signals CLK, data DQ1, and data DQ2. The interface chip 170 may relay communication between the first to fourth chips 110 to 140 and the external host device. The interface chip 170 may receive signals from the external host device or output signals to the external host device, through, for example but not limited to, a ball array 181.

The first to fourth chips 110 to 140 may perform refresh operations to retain the data stored in the memory cores. In an embodiment, one chip of the first to fourth chips 110 to 140 may generate a plurality of refresh period signals to be used in the respective first to fourth chips 110 to 140, and may transmit the plurality of refresh period signals which are generated, to the respective chips. For example, the first chip 110 may generate first to fourth refresh period signals for refresh operations of itself and the second to fourth chips 120 to 140. The first chip 110 may transmit the second to fourth refresh period signals to the second to fourth chips 120 to 140. Also, for example, the second chip 120 may generate first to fourth refresh period signals for refresh operations of itself and the first, third, and fourth chips 110, 130, and 140. Each of the first to fourth chips 110 to 140 may selectively receive one of the plurality of refresh period signals based on its chip ID signal. Thus, the first to fourth chips 110 to 140 may selectively receive refresh period signals allocated to them among the plurality of refresh period signals. In the stacked semiconductor apparatus 1, the refresh operations of the first to fourth chips 110 to 140 may be separately performed from one another. In the case where the refresh operations of the first to fourth chips 110 to 140 are performed in an overlapping manner, problems may occur whereby peak current may be produced and as a result a power level may decrease. Even when the external host device controls the refresh operations of the respective chips to not overlap with one another overlapping may still occur when the respective chips individually generate refresh period signals for refresh operations. This undesired overlapping with one another is caused by the skews of the respective chips. Therefore, in an embodiment, due to the fact that, for example, the first chip 110 generates all refresh period signals to be used in the first to fourth chips 110 to 140 which constitute the stacked semiconductor apparatus 1 and transmits the generated refresh period signals to the other chips 120 to 140, refresh operations may be stably performed regardless of the skews of the respective chips.

Figure 2:
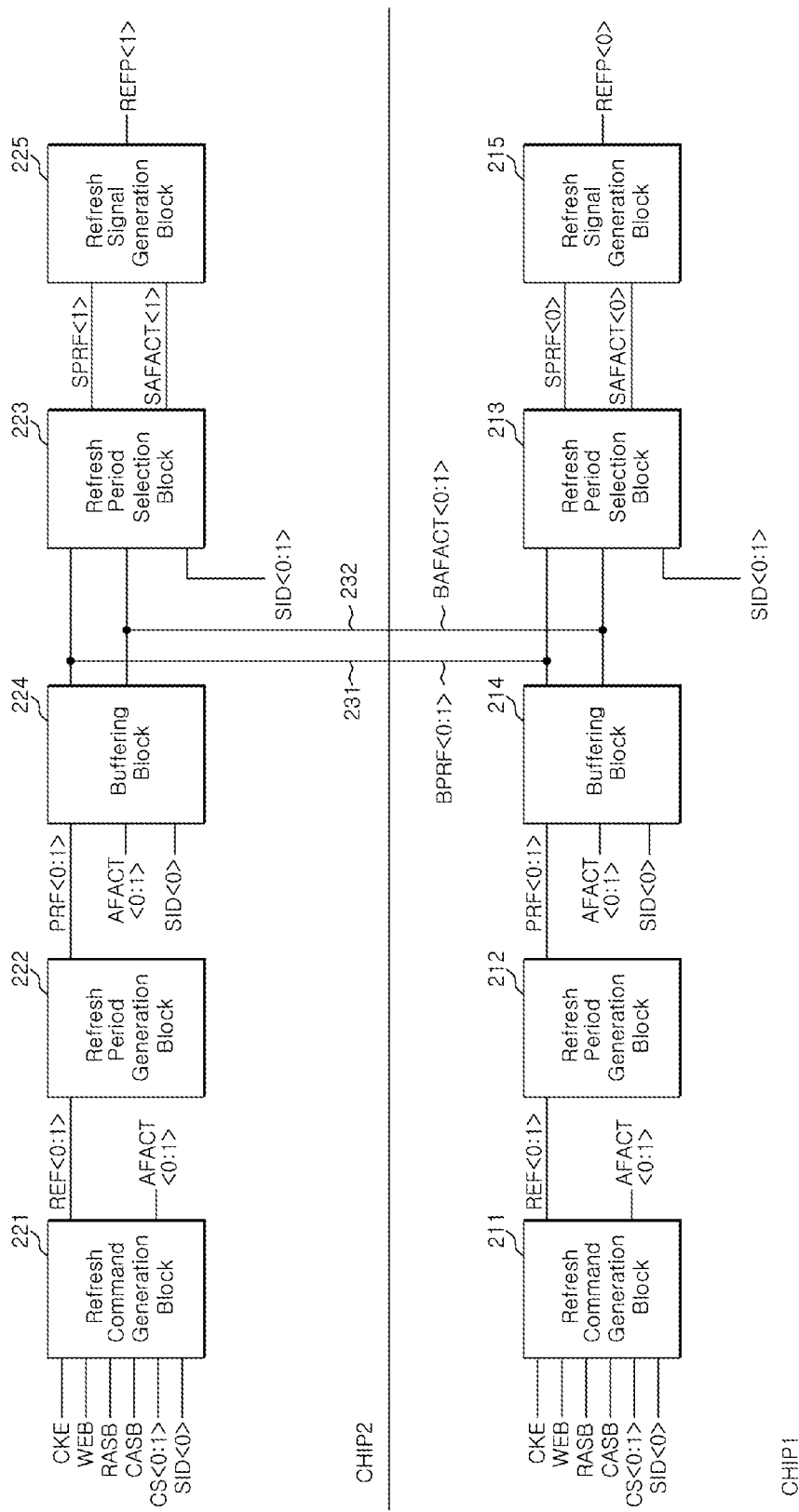
FIG. 2 is a diagram illustrating a representation of the configuration of a stacked semiconductor apparatus in accordance with an embodiment.

FIG. 2 is a diagram illustrating a representation of the configuration of a stacked semiconductor apparatus 2 in accordance with an embodiment. Referring to FIG. 2, the stacked semiconductor apparatus 2 may include first and second chips CHIP1 and CHIP2. The first chip CHIP1 may include a first chip refresh command generation block 211 and a first chip refresh period generation block 212. The first chip CHIP1 may also include a first chip refresh period selection block 213. The first chip refresh command generation block 211 may receive command signals and chip select signals. The first chip refresh command generation block 211 may also receive a chip ID signal. The first chip refresh command generation block 211 may also generate internal refresh signals. The command signals may include a plurality of commands which are inputted from an external host device to the stacked semiconductor apparatus 2. Without a limiting sense, for example, the plurality of commands may include, amongst others, a clock enable signal CKE, a write enable signal WEB, a row address strobe signal RASB, and a column address strobe signal CASB. The chip select signals may have a number corresponding to the number of chips which constitute the stacked semiconductor apparatus 2. The chip select signals may be signals determining the operation of which chip is commanded by inputted command signals. The chip select signals may include first and second chip select signals CS<0:1> since the stacked semiconductor apparatus 2 includes the first and second chips CHIP1 and CHIP2. If the first chip select signal CS<0> is enabled, according to the command signals CKE, WEB, RASB and CASB inputted together with the first chip select signal CS<0>, the first chip CHIP1 may perform an operation corresponding to the command signals CKE, WEB, RASB and CASB. If the second chip select signal CS<1> is enabled, according to the command signals CKE, WEB, RASB and CASB inputted together with the second chip select signal CS<1>, the second chip CHIP2 may perform an operation corresponding to the command signals CKE, WEB, RASB and CASB. Chip ID signals are, for example, signals which may enable the internal circuits of chips constituting the stacked semiconductor apparatus 2. The first and second chips CHIP1 and CHIP2 constituting the stacked semiconductor apparatus 2 may have their respective chip ID signals SID<0:1>. Thus, the first and second chips CHIP1 and CHIP2 may be enabled and operate when a chip ID signal inputted from the external host device and their chip ID signals SID<0:1> correspond to each other. In an embodiment, the first chip CHIP1 may generate all refresh period signals to be used in the first and second chips CHIP1 and CHIP2. Therefore, in response to the command signals CKE, WEB, RASB and CASB, the first and second chip select signals CS<0:1> and the first chip ID signal SID<0>, the first chip refresh command generation block 211 may generate first and second internal refresh signals REF<0:1>. The first internal refresh signal REF<0> which may be designated as a signal for the refresh operation of the first chip CHIP1 is a signal which may be continuously enabled while the refresh operation of the first chip CHIP1 is performed. The second internal refresh signal REF<1> which may be designated as a signal for the refresh operation of the second chip CHIP2 is a signal which may be continuously enabled while the refresh operation of the second chip CHIP2 is performed. The first chip refresh command generation block 211 may receive not only the first chip select signal CS<0> but also the second chip select signal CS<1>. The first chip refresh command generation block 211 may then generate both the first internal refresh signal REF<0> for the first chip CHIP1 and the second internal refresh signal REF<1> for the second chip CHIP2. In response to the command signals CKE, WEB, RASB and CASB, the first and second chip select signals CS<0:1> and the first chip ID signal SID<0>, in an embodiment, the first chip refresh command generation block 211 may additionally generate first and second refresh start signals AFACT<0:1>. The first refresh start signal AFACT<0> may be used as a signal which informs that the refresh operation of the first chip CHIP1 is started. Additionally, the second refresh start signal AFACT<1> may be used as a signal which informs that the refresh operation of the second chip CHIP2 is started.

In response to the first and second internal refresh signals REF<0:1> the first chip refresh period generation block 212 may generate first and second refresh period signals PRF<0:1>. The first chip refresh period generation block 212 may generate the first refresh period signal PRF<0> in response to the first internal refresh signal REF<0>. The first chip refresh period generation block 212 may generate the second refresh period signal PRF<1> in response to the second internal refresh signal REF<1>. The first and second refresh period signals PRF<0:1> may include pluralities of pulses which are enabled with a predetermined time interval to allow the first and second chips CHIP1 and CHIP2 to perform the refresh operations within a predetermined period.

The first chip refresh period selection block 213 may receive the first and second refresh period signals PRF<0:1>. In response to the first chip ID signal SID<0> the first chip refresh period selection block 213 may output one of the first and second refresh period signals PRF<0:1>. Since the first chip refresh period selection block 213 may select a refresh period signal for the refresh operation of the first chip CHIP1, the first chip refresh period selection block 213 may select the first refresh period signal PRF<0> between the first and second refresh period signals PRF<0:1> in response to the first chip ID signal SID<0>.

The second chip CHIP2 may include a second chip refresh period selection block 223. The second chip refresh period selection block 223 may receive the first and second refresh period signals PRF<0:1> from the first chip refresh period generation block 212. The second chip refresh period selection block 223 may receive the first and second refresh period signals PRF<0:1> from the first chip CHIP1 through electrical connection means 231 and 232 of the stacked semiconductor apparatus 2. Without a limiting sense, the electrical connection means 231 of the stacked semiconductor apparatus 2 may include, for example, through vias, wires, and so forth, and specifically, may be through silicon vias. The second chip refresh period selection block 223 may receive the first and second chip ID signals SID<0:1> and may output one of the first and second refresh period signals PRF<0:1>. Since the second chip refresh period selection block 223 may select a refresh period signal for the refresh operation of the second chip CHIP2, the second chip refresh period selection block 223 may select the second refresh period signal PRF<1> between the first and second refresh period signals PRF<0:1> in response to the second chip ID signal SID<1>.

Referring to FIG. 2, the first chip CHIP1 may further include a first chip buffering block 214. The first chip CHIP1 may also include a first chip refresh signal generation block 215. The first chip buffering block 214 may buffer and output the first and second refresh period signals PRF<0:1>. The first and second refresh period signals PRF<0:1> may be generated by the first chip refresh period generation block 212. The first chip buffering block 214 may be electrically connected with the electrical connection means 231 of the stacked semiconductor apparatus 2. The first chip buffering block 214 may output first and second buffered refresh period signals BPRF<0:1> to the electrical connection means 231. In response to the first chip ID signal SID<0> the first chip buffering block 214 may buffer the first and second refresh period signals PRF<0:1>. Further, the first chip buffering block 214 may buffer and output the first and second refresh start signals AFACT<0:1>. The first and second refresh start signals AFACT<0:1> may be generated by the first chip refresh command generation block 211. The first chip buffering block 214 may be electrically connected with the other electrical connection means 232 of the stacked semiconductor apparatus 2. The first chip buffering block 214 may output first and second buffered refresh start signals BAFACT<0:1> to the electrical connection means 232. The first and second buffered refresh period signals BPRF<0:1> may be substantially the same signals as the first and second refresh period signals PRF<0:1>. Thus, in an embodiment, the first and second refresh period signals PRF<0:1> and the first and second buffered refresh period signals BPRF<0:1> may be mentioned as having the same meanings and as having substantially the same components. Moreover, the first and second buffered refresh start signals BAFACT<0:1> may be substantially the same signals as the first and second refresh start signals AFACT<0:1>. Thus, in an embodiment, the first and second refresh start signals AFACT<0:1> and the first and second buffered refresh start signals BAFACT<0:1> may be mentioned as having the same meanings and as having substantially the same components.

The first chip refresh period selection block 213 may receive the first and second refresh start signals AFACT<0:1> through the electrical connection means 232. The first chip refresh period selection block 213 may select and output the first refresh start signal AFACT<0> in response to the first chip ID signal SID<0>. Also, the second chip refresh period selection block 223 may receive the first and second refresh start signals AFACT<0:1> through the electrical connection means 232. The second chip refresh period selection block 223 may select and output the second refresh start signal AFACT<1> in response to the second chip ID signal SID<1>.

The first chip refresh signal generation block 215 may generate a first refresh pulse signal REFP<0> in response to a first selected refresh period signal SPRF<0> and a first selected refresh start signal SAFACT<0>. The first selected refresh period signal SPRF<0> and a first selected refresh start signal SAFACT<0> may be selected by the first chip refresh period selection block 213. The first refresh pulse signal REFP<0> may be inputted to circuits which perform the refresh operation of the first chip CHIP1. As such, the circuits may perform an operation for retaining the data stored in the memory core of the first chip CHIP1. Selected refresh period signals SPRF<0:1> and selected refresh start signals SAFACT<0:1> which are described above or will be described later are substantially the same signals as the first and second refresh period signals PRF<0:1> or the first and second buffered refresh period signals BPRF<0:1> and the first and second refresh start signals AFACT<0:1> or the first and second buffered refresh start signals BAFACT<0:1>, and thus, may be mentioned as having the same meanings and as having substantially the same components.

Referring to FIG. 2, the second chip CHIP2 may further include one or a plurality of second chip refresh command generation blocks 221 and second chip refresh period generation blocks 222. The second chip CHIP2 may further include one or a plurality of second chip buffering blocks 224 and second chip refresh signal generation blocks 225. The second chip refresh command generation block 221 may receive the command signals CKE, WEB, RASB and CASB, and the first and second chip select signals CS<0:1>. The second chip refresh command generation block 221 may also receive the first chip ID signal SID<0>. Even though the command signals CKE, WEB, RASB and CASB and the first and second chip select signals CS<0:1> are inputted, the second chip refresh command generation block 221 may not generate internal refresh signals REF<0:1> and refresh start signals AFACT<0:1>. This is because the second chip refresh command generation block 221 receives the first chip ID signal SID<0>.

The second chip refresh period generation block 222 may be electrically connected with the second chip refresh command generation block 221. Also, the second chip refresh period generation block 222 may generate refresh period signals PRF<0:1>. The second chip refresh period generation block 222 does not generate the refresh period signals PRF<0:1> because the second chip refresh command generation block 221 receives the first chip ID signal SID<0> and does not generate the internal refresh signals REF<0:1>. The second chip buffering block 224 may be electrically connected with the second chip refresh period generation block 222. Additionally, the second chip buffering block 224 may receive the first chip ID signal SID<0>. Also, the second chip buffering block 224 may be electrically connected with the electrical connection means 231 and 232. The second chip buffering block 224 may be always disabled because the second chip buffering block 224 receives the first chip ID signal SID<0>. In an embodiment, the second chip refresh command generation block 221, the second chip refresh period generation block 222 and the second chip buffering block 224 are configured not to operate. The second chip refresh command generation block 221, the second chip refresh period generation block 222 and the second chip buffering block 224 have substantially the same structures and substantially the same electrical connection relationships as the first chip refresh command generation block 211, the first chip refresh period generation block 212 and the first chip buffering block 214. Since chips which constitute a stacked semiconductor apparatus may be manufactured to have substantially the same structure so as to reduce the manufacturing costs, the first and second chips CHIP1 and CHIP2 in accordance with an embodiment may have substantially the same structure. However, the plurality of component elements disposed in the second chip CHIP2 may not operate by receiving the first chip ID signal SID<0>.

The second chip refresh signal generation block 225 may receive a second selected refresh period signal SPRF<1> and a second selected refresh start signal SAFACT<1>. The second selected refresh period signal SPRF<1> and a second selected refresh start signal SAFACT<1> may be selected by the second chip refresh period selection block 223. As such, the second chip refresh signal generation block 225 may generate a second refresh pulse signal REFP<1>. The second refresh pulse signal REFP<1> may be inputted to circuits. These circuits may perform the refresh operation of the second chip CHIP2. Additionally, the circuits may perform an operation for retaining the data stored in the memory core of the second chip CHIP2.

Figure 3:
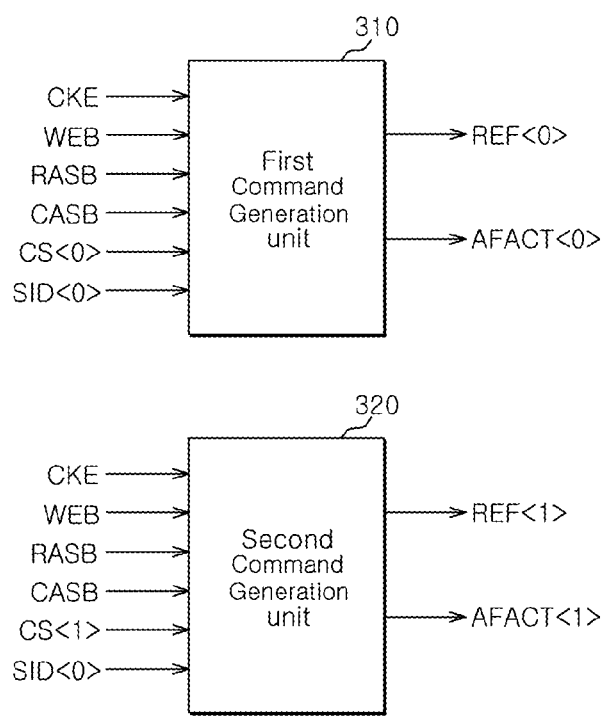
FIG. 3 is a diagram illustrating a representation of the configuration of an example of an embodiment of the first chip refresh command generation block illustrated in FIG. 2.

FIG. 3 is a diagram illustrating a representation of the configuration of an example of an embodiment of the first chip refresh command generation block 211 as illustrated in FIG. 2. The first chip refresh command generation block 211 may include a first command generation unit 310. The first chip refresh command generation block 211 may also include a second command generation unit 320. The first command generation unit 310 may receive the command signals CKE, WEB, RASB and CASB, the first chip select signal CS<0> and the first chip ID signal SID<0>. The first command generation unit 310 may also generate the first internal refresh signal REF<0> and the first refresh start signal AFACT<0> which are associated with the refresh operation of the first chip CHIP1. The second command generation unit 320 may receive the command signals CKE, WEB, RASB and CASB, the second chip select signal CS<1> and the first chip ID signal SID<0>. The second command generation unit 320 may also generate the second internal refresh signal REF<1> and the second refresh start signal AFACT<1>. These signals, the second internal refresh signal REF<1> and the second refresh start signal AFACT<1>, may be associated with the refresh operation of the second chip CHIP2.

Figure 4:
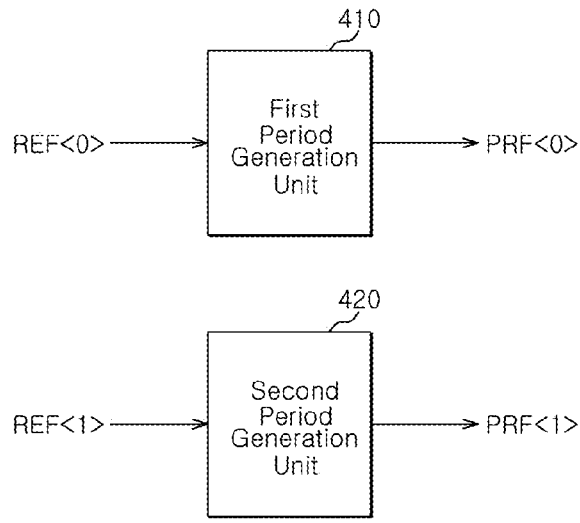
FIG. 4 is a diagram illustrating a representation of the configuration of an example of an embodiment of the first chip refresh period generation block illustrated in FIG. 2.

FIG. 4 is a diagram illustrating a representation of the configuration of an example of an embodiment of the first chip refresh period generation block 212 as illustrated in FIG. 2. The first chip refresh period generation block 212 may include a first period generation unit 410. The first chip refresh period generation block 212 may also include a second period generation unit 420. In response to the first internal refresh signal REF<0> the first period generation unit 410 may generate the first refresh period signal PRF<0> based on information associated with the refresh operation of the first chip CHIP1. In response to the second internal refresh signal REF<1> the second period generation unit 420 may generate the second refresh period signal PRF<1> based on information associated with the refresh operation of the second chip CHIP2. As aforementioned above, the first and second refresh period signals PRF<0:1> have a plurality of pulses. The first and second period generation units 410 and 420 may cause the pulses of the first and second refresh period signals PRF<0:1> not to overlap with each other, based on the information associated with the refresh operations of the first and second chips CHIP1 and CHIP2.

Figure 5:
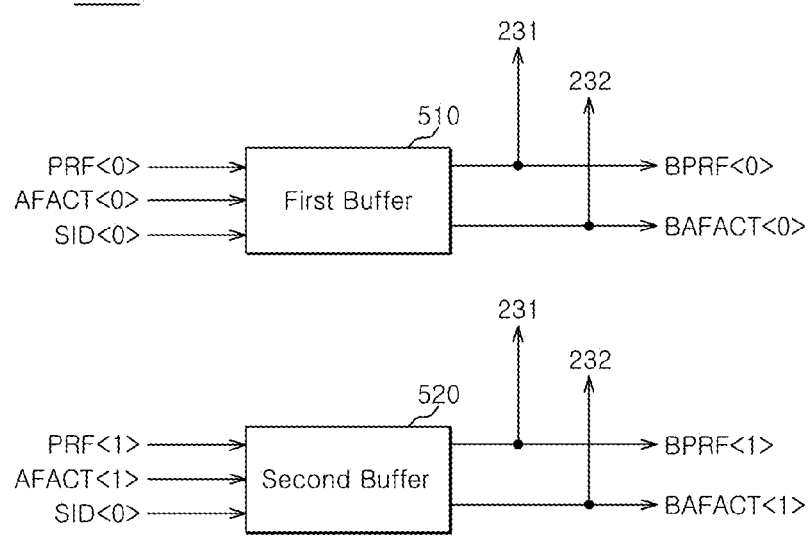
FIG. 5 is a diagram illustrating a representation of the configuration of an example of an embodiment of the first chip buffering block illustrated in FIG. 2.

FIG. 5 is a diagram illustrating a representation of the configuration of an example of an embodiment of the first chip buffering block 214 as illustrated in FIG. 2. The first chip buffering block 214 may include first and second buffers 510 and 520. The first buffer 510 may buffer the first refresh period signal PRF<0> and the first refresh start signal AFACT<0> in response to the first chip ID signal SID<0>. Then the first buffer 510 may output the first buffered refresh period signal BPRF<0> and the first buffered refresh start signal BAFACT<0>. The first buffered refresh period signal BPRF<0> and the first buffered refresh start signal BAFACT<0> may be received by the first chip refresh period selection block 213. Further, the first buffered refresh period signal BPRF<0> and the first buffered refresh start signal BAFACT<0> may be received by the second chip refresh period selection block 223 through the electrical connection means 231 and 232, respectively. The second buffer 520 may buffer the second refresh period signal PRF<1> and the second refresh start signal AFACT<1> in response to the first chip ID signal SID<0>. Then the second buffer 520 may output the second buffered refresh period signal BPRF<1> and the second buffered refresh start signal BAFACT<1>. The second buffered refresh period signal BPRF<1> and the second buffered refresh start signal BAFACT<1> may be received by the first chip refresh period selection block 213. Further, the second buffered refresh period signal BPRF<1> and the second buffered refresh start signal BAFACT<1> may be received by the second chip refresh period selection block 223 through the electrical connection means 231 and 232, respectively. While it is illustrated in FIGS. 2 and 5 that the first and second refresh period signals PRF<0:1> are transmitted through the one electrical connection means 231, it is noted that the first and second refresh period signals PRF<0:1> may be individually transmitted through a plurality of electrical connection means. Similarly, it is noted that the first and second refresh start signals AFACT<0:1> may be individually transmitted through a plurality of electrical connection means. In an embodiment, the first and second buffers 510 and 520 may include a plurality of tri-state inverters. The plurality of tri-state inverters included in the first and second buffers 510 and 520 may operate under the control of the first chip ID signal SID<0>. As aforementioned above, the second chip buffering block 224 may have substantially the same configuration as the first chip buffering block 214. However, the second chip buffering block 224 may not operate because the second chip buffering block 224 receives the first chip ID signal SID<0>.

Figure 6:
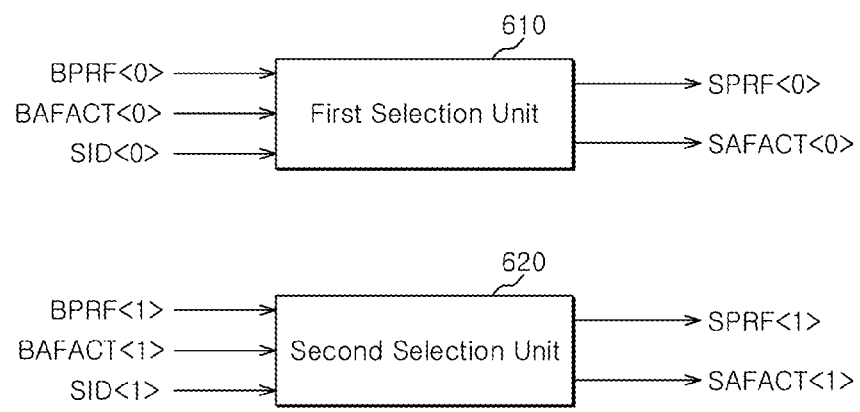
FIG. 6 is a diagram illustrating a representation of the configuration of an example of an embodiment of the first chip refresh period selection block illustrated in FIG. 2.

FIG. 6 is a diagram illustrating a representation of the configuration of an example of an embodiment of the first chip refresh period selection block 213 illustrated in FIG. 2. The first chip refresh period selection block 213 may include first and second selection units 610 and 620. The first selection unit 610 may receive the first buffered refresh period signal BPRF<0> and the first buffered refresh start signal BAFACT<0> which are buffered by the first buffer 510. The first selection unit 610 may output the first buffered refresh period signal BPRF<0> and the first buffered refresh start signal BAFACT<0> as the first selected refresh period signal SPRF<0> and the first selected refresh start signal SAFACT<0> in response to the first chip ID signal SID<0>. The second selection unit 620 may receive the second buffered refresh period signal BPRF<1> and the second buffered refresh start signal BAFACT<1> which are buffered by the second buffer 520. The second selection unit 620 may output the second buffered refresh period signal BPRF<1> and the second buffered refresh start signal BAFACT<1> as the second selected refresh period signal SPRF<1> and the second selected refresh start signal SAFACT<1> in response to the second chip ID signal SID<1>. The second chip refresh period selection block 223 may have substantially the same configuration as the first chip refresh period selection block 213. The first chip refresh period selection block 213 may output the first refresh period signal PRF<0> and the first refresh start signal AFACT<0> in response to the first chip ID signal SID<0>. The second chip refresh period selection block 223 may output the second refresh period signal PRF<1> and the second refresh start signal AFACT<1> in response to the second chip ID signal SID<1>. In an embodiment, the first and second selection units 610 and 620 may include a plurality of tri-state inverters which operate under the control of the first and second chip ID signals SID<0:1>.

Figure 7:
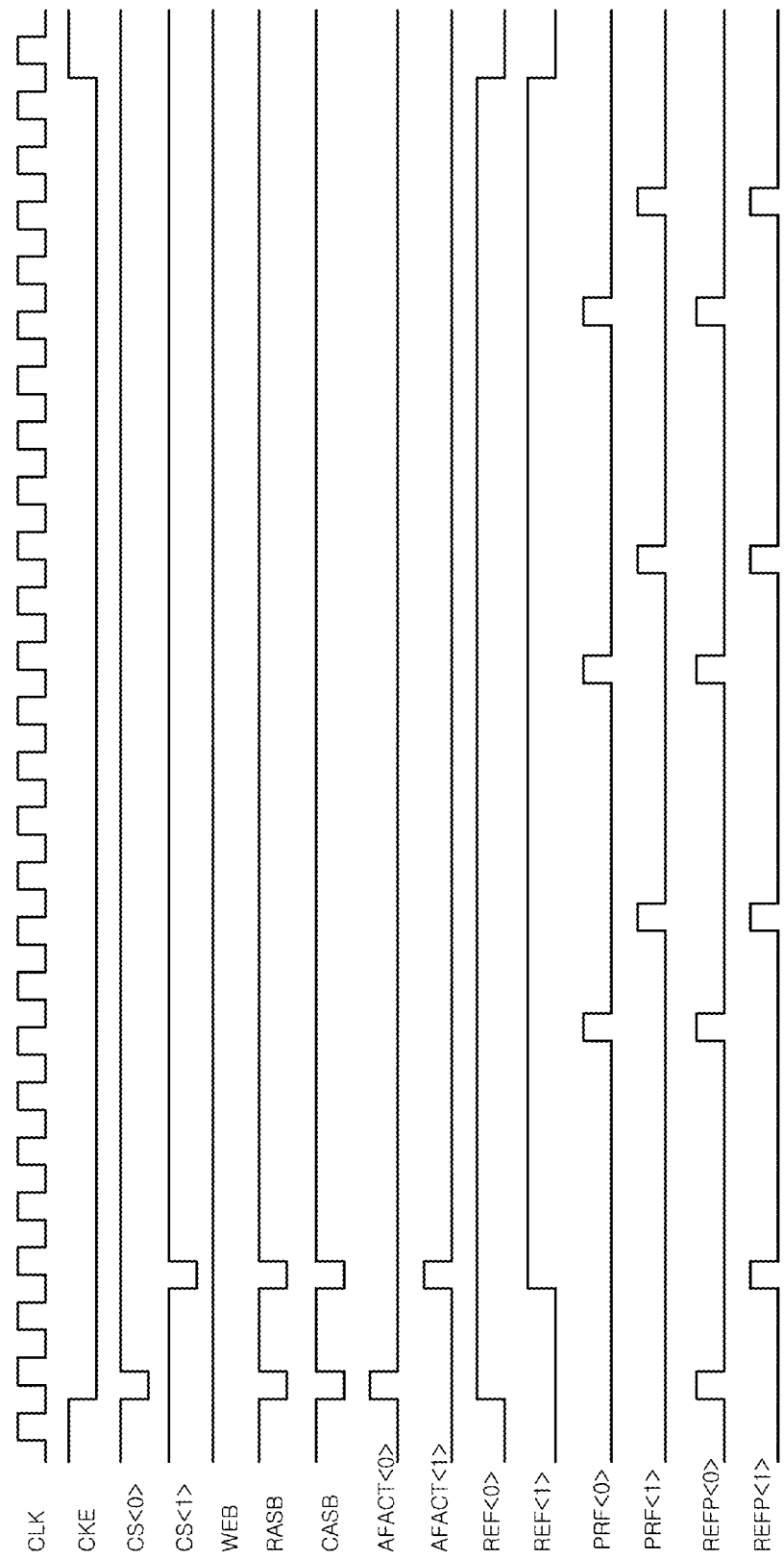
FIG. 7 is a timing diagram illustrating a representation of the operations of the stacked semiconductor apparatus in accordance with an embodiment.

FIG. 7 is a timing diagram illustrating a representation of the operations of the stacked semiconductor apparatus 2 in accordance with an embodiment. Operations of the stacked semiconductor apparatus 2 in accordance with an embodiment will be described below with reference to FIGS. 2 to 7. First, if the first chip select signal CS<0> is enabled and the command signals CKE, WEB, RASB and CASB for the refresh operation are received, the first command generation unit 310 of the first chip refresh command generation block 211 may generate the first internal refresh signal REF<0> and the first refresh start signal AFACT<0>. At this time, since the second chip refresh command generation block 221 receives the first chip ID signal SID<0>, the second chip refresh command generation block 221 does not generate the first internal refresh signal REF<0> and the first refresh start signal AFACT<0>. The first period generation unit 410 of the first chip refresh period generation block 212 may generate the first refresh period signal PRF<0> from the first internal refresh signal REF<0>. The first refresh period signal PRF<0> and the first refresh start signal AFACT<0> may be selected by the first selection unit 610 of the first chip refresh period selection block 213 and may be received by the first chip refresh signal generation block 215. Accordingly, the first refresh pulse REFP<0> having a plurality of pulses which are generated with a predetermined time period may be generated. Additionally, the first chip CHIP1 may perform the refresh operation according to the first refresh pulse REFP<0>.

If the second chip select signal CS<1> is enabled and the command signals CKE, WEB, RASB and CASB for the refresh operation are inputted, the second command generation unit 320 of the first chip refresh command generation block 211 may generate the second internal refresh signal REF<1> and the second refresh start signal AFACT<1>. At this time, since the second chip refresh command generation block 221 receives the first chip ID signal SID<0>, the second chip refresh command generation block 221 does not generate the second internal refresh signal REF<1> and the second refresh start signal AFACT<1>. The second period generation unit 420 of the first chip refresh period generation block 212 may generate the second refresh period signal PRF<1> from the second internal refresh signal REF<1>. The second refresh period signal PRF<1> and the second refresh start signal AFACT<1> may be transmitted to the second chip refresh period selection block 223 through the electrical connection means 231 and 232, and may be selected by the second chip refresh period selection block 223 and may be received by the second chip refresh signal generation block 225. Accordingly, the second refresh pulse REFP<1> having a plurality of pulses which are generated with a predetermined time period may be generated. Additionally, the second chip CHIP2 may perform the refresh operation according to the second refresh pulse REFP<1>. Thereafter, if the command signal CKE for ending the refresh operations is inputted, the first and second internal refresh signals REF<0:1> are disabled, and the refresh operations of the first and second chips CHIP1 and CHIP2 may be ended. As described above, the first chip refresh command generation block 211 and the first chip refresh period generation block 212 may generate both the first and second refresh period signals PRF<0:1> and the first and second refresh start signals AFACT<0:1> for the refresh operations of the first and second chips CHIP1 and CHIP2. Therefore, it is possible to cause a plurality of pulses of the first and second refresh pulses REFP<0:1> generated by the first and second refresh signal generation blocks 215 and 225, not to overlap with each other.

Figure 8:
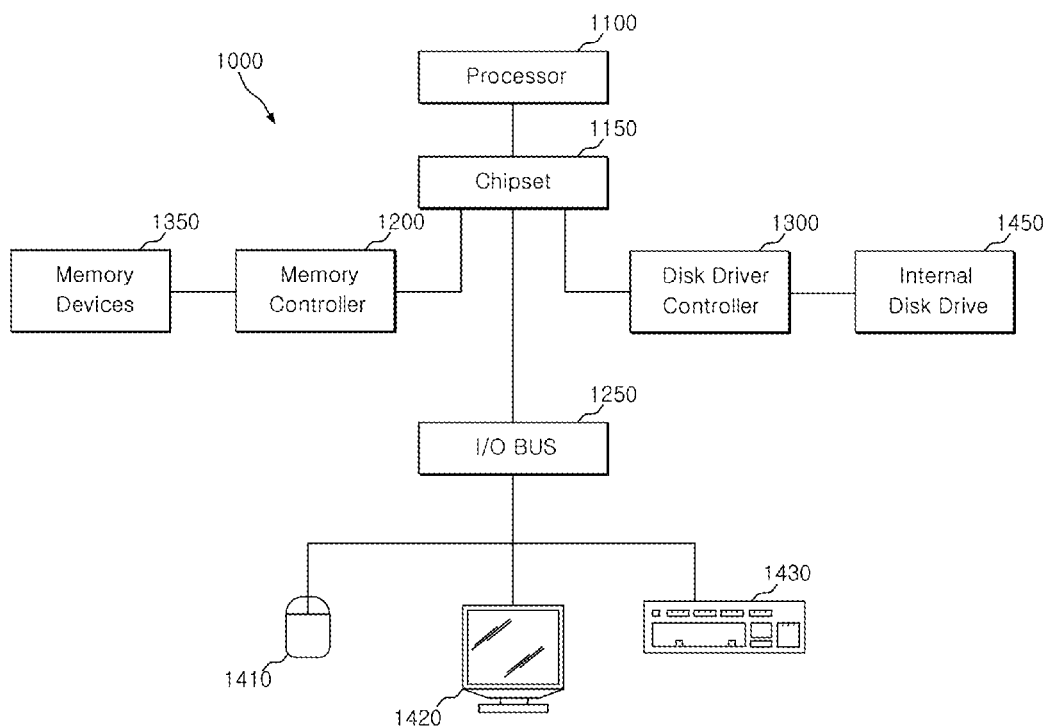
FIG. 8 illustrates a block diagram representation of a system employing the stacked semiconductor apparatus in accordance with the embodiments discussed above with relation to FIGS. 1-7.

The semiconductor apparatus or stacked semiconductor apparatus discussed above is particular useful in the design of memory devices, processors, and computer systems. For example, referring to FIG. 8, a block diagram of a system employing the stacked semiconductor apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller

1200 may include at least one stacked semiconductor apparatus or semiconductor apparatus as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the stacked semiconductor apparatus or semiconductor apparatus as discussed above with relation to FIGS. 1-7, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the stacked semiconductor apparatus or semiconductor apparatus as discussed above with relation to FIGS. 1-7. In alternate embodiments, such as cellular phones or digital cameras, the components may differ from the embodiments shown in FIG. 8.

While various embodiments have been described above, it will be understood to those skilled in the art that the embodiments described are by way of example only. Accordingly, the stacked semiconductor apparatus or semiconductor apparatus for generating a refresh signal described herein should not be limited based on the described embodiments. Rather, the stacked semiconductor apparatus or semiconductor apparatus for generating a refresh signal described herein should only be limited in light of the claims that follow when taken in conjunction with the above description and accompanying drawings.

What is claimed is:

1. A stacked semiconductor apparatus including a plurality of chips which are stacked one upon the other,
    wherein one chip of the plurality of chips is configured to generate a plurality of refresh period signals for performing refresh operations within the plurality of chips, and is configured to transmit the plurality of refresh period signals to the plurality of chips excluding the one chip, and
    wherein the plurality of chips respectively receive refresh period signals allocated to them according to chip ID signals, and perform the refresh operations.

2. The stacked semiconductor apparatus according to claim 1, wherein each of the plurality of chips comprises a memory chip and include a memory core for storing data within the chip.

3. The stacked semiconductor apparatus according to claim 1, wherein the one chip generates the plurality of refresh period signals in response to command signals, a plurality of chip select signals, and a chip ID signal which is associated with a respective chip.

4. The stacked semiconductor apparatus according to claim 1, wherein pulses of the plurality of refresh period signals do not interfere with each other.

5. The stacked semiconductor apparatus according to claim 1, wherein the plurality of chips comprise refresh selection blocks which select and receive the allocated refresh period signals among the plurality of refresh period signals, in response to chip ID signals which are respectively associated with the plurality of chips.

6. A stacked semiconductor apparatus comprising:
    first and second chips stacked one upon the other,
    the first chip comprising:
    a first chip refresh command generation block configured to generate first and second internal refresh signals in response to a command signal, a chip select signal and a first chip ID signal;
    a first chip refresh period generation block configured to generate first and second refresh period signals in response to the first internal refresh signal and the second internal refresh signal; and
    a first chip refresh period selection block configured to select and output the first refresh period signal after the first refresh period signal and before the second refresh period signal, in response to a first chip ID signal, and
    the second chip comprising:
    a second chip refresh period selection block configured to select and output the second refresh period signal before the first refresh period signal and after the second refresh period signal, in response to a second chip ID signal.

7. The stacked semiconductor apparatus according to claim 6,
    wherein the chip select signal comprise a first chip select signal and a second chip select signal, and
    wherein the first chip refresh command generation block is configured to generate the first internal refresh signal for a refresh operation of the first chip, in response to the first chip select signal, and configured to generate the second internal refresh signal for a refresh operation of the second chip, in response to the second chip select signal.

8. The stacked semiconductor apparatus according to claim 6, wherein the first chip refresh period generation block generates the first and second refresh period signals having a plurality of pulses which are enabled with a predetermined time interval, in response to the first and second internal refresh signals, respectively.

9. The stacked semiconductor apparatus according to claim 8, wherein the pulses of the first refresh period signals do not overlap with the second refresh period signals.

10. The stacked semiconductor apparatus according to claim 6, wherein the first chip further comprises:
    a first chip buffering block configured to buffer the first and second refresh period signals in response to the first chip ID signal, and configured to transmit first and second buffered refresh period signals to the second chip.

11. The stacked semiconductor apparatus according to claim 10,
wherein the first chip refresh command generation block is configured to generate first and second refresh start signals in response to the command signal, the chip select signal and the first chip ID signal, and
wherein the first chip buffering block is configured to buffer the first and second refresh start signals in response to the first chip ID signal, and is configured to transmit first and second buffered refresh start signals to the second chip.

12. The stacked semiconductor apparatus according to claim 11,
wherein the first chip refresh period selection block selects and outputs the first refresh start signal between the first and second refresh start signals, in response to the first chip ID signal, and
wherein the second chip refresh period selection block selects and outputs the second refresh start signal between the first and second refresh start signals, in response to the second chip ID signal.

13. The stacked semiconductor apparatus according to claim 12,
wherein the first chip further comprises:
a first chip refresh signal generation block configured to generate a first refresh pulse signal in response to the first refresh start signal and the first refresh period signal, and
wherein the second chip further comprises:
a second chip refresh signal generation block configured to generate a second refresh pulse signal in response to the second refresh start signal and the second refresh period signal.

14. The stacked semiconductor apparatus according to claim 6,
wherein the second chip further comprises:
a second chip refresh command generation block configured to generate the first and second internal refresh signals in response to the command signal, the chip select signal and the first chip ID signal, and
wherein the second chip refresh command generation block does not operate in response to the first chip ID signal.

15. A semiconductor apparatus comprising:
at least two chips stacked one upon the other; and
one chip of the at least two chips configured to generate a refresh period signal for one or more of the chips and configured to transmit the refresh period signal to another stacked chip located outside the one chip,
wherein the another stacked chip is configured to perform a refresh operation after receiving the refresh period signal,
wherein the refresh period signal is allocated to the another stacked chip according to a chip identification signal, and
wherein the refresh period signal is used for the refresh operation associated within a respective chip.

16. The semiconductor apparatus of claim 15, wherein each chip includes through-silicon via and are communicatively coupled with each other through bumps located between the through-silicon via and chips.

17. The semiconductor apparatus of claim 16, further comprising:
an interface chip coupled to the one chip located at the bottom of the stacked chips;
wherein the interface chip receives data from outside the semiconductor apparatus and transmits the data to the stacked chips.

18. The semiconductor apparatus of claim 17, wherein each stacked chip comprises a memory chip and include a memory core for storing data.

19. The semiconductor apparatus of claim 18, wherein the one chip located at the bottom of the stacked chips is configured to operate as a memory controller.

20. The semiconductor apparatus of claim 16, further comprising:
an interface chip coupled to the one chip located at the bottom of the stacked chips;
wherein the interface chip receives command signals from outside the interface chip and transmits the command signals to the one chip located at the bottom of the stacked chips, and
wherein the one chip generates the plurality of refresh period signals in response to the command signals.

* * * * *